United States Patent [19]

Morrison et al.

[11] 4,112,363
[45] Sep. 5, 1978

[54] MULTICONTACT TEST PROBE APPARATUS

[75] Inventors: Robert A. Morrison, Granada Hills; Lyle C. Armstrong, Sunland, both of Calif.

[73] Assignee: Lockheed Aircraft Corporation, Burbank, Calif.

[21] Appl. No.: 754,346

[22] Filed: Dec. 27, 1976

[51] Int. Cl.² .................... G01R 31/02; G01R 1/06
[52] U.S. Cl. ........................... 324/158 P; 324/72.5; 324/158 F
[58] Field of Search ............. 324/158 P, 158 F, 73 R, 324/72.5; 339/17 CF, 176 M

[56] References Cited

U.S. PATENT DOCUMENTS

| 3,573,617 | 4/1971 | Randolph et al. | 324/158 F |
| 3,761,808 | 9/1973 | Ryan | 324/158 F |
| 3,968,433 | 7/1976 | Dobarganes | 324/158 F |

Primary Examiner—Rudolph V. Rolinec
Assistant Examiner—Ernest F. Karlsen
Attorney, Agent, or Firm—Ralph M. Flygare

[57] ABSTRACT

A test probe apparatus having a housing movable into engagement with a printed circuit device connected to a circuit board with a plurality of electrical contact members extending at various angles to the circuit board, and a plurality of contact probes mounted by said housing for engaging each of said contact members with a constant force insufficient to damage their connection to the circuit device, and a mounting device for holding the housing in engagement with the circuit device while attached to the printed circuit board.

4 Claims, 3 Drawing Figures

MULTICONTACT TEST PROBE APPARATUS

BACKGROUND OF THE INVENTION

In the construction of electronic equipment, the electrical circuitry is, at the present time, most commonly applied to a printed circuit board which mounts various types of electronic components. A common form of an electronic device includes a rectangular body section which has a plurality of probes extending on each side thereof. These type of devices have frequently been called "flat packs" and normally include eight in number of electrical contacts extending from each side of the device.

The normal procedure is to electrically connect each of the electrical contacts of the device to the circuitry on the printed circuit board. These devices are quite small in size and the electrical connections to the printed circuit board are quite fragile. Only a small force is required to cause breakage of the electrical connection of one of these electrical contacts.

At times, one of these electrical devices may fail. This failure may not be readily apparent and therefore it is necessary to electrically test each of the devices mounted upon the board until the faulty device is discovered and then replaced. The normal test procedure is to physically contact the electrical contacts by a hand-held probe assembly. If the probe operator touches an electrical contact with a slightly excessive force, the electrical contact may break or the electrical connection may be weakened. If this does occur, the electrical device then requires replacement which, prior to the initiating of the testing procedure, may not have been necessary.

SUMMARY OF THE INVENTION

The test probe apparatus of this invention is designed in particular to be employed in conjunction with an integrated circuit device which is normally attached to a printed circuit board. The integrated circuit device includes a body section and has a plurality of electrical contact tabs extending on either side thereof. The apparatus of this invention includes a housing within which are mounted a plurality of spaced apart electrical contact probes and these probes are spaced apart in the same pattern as the contact tabs. The body section of the integrated circuit device is adapted to be received by an elongated recess formed in the housing and the tabs extend through slots in side projections on the housing. The housing is moved against an integrated circuit device by means of a clamp which engages the bottom of the housing and the side of the circuit board opposite the circuit device. Each probe is electrically connected by a conductive wire to the test equipment which tests the circuits through the tabs. Each of the probes is biased to an extended position and as the circuit device moves into the housing, each probe engages a contact tab and moves with the tab toward a retracted position. The final probe position will depend upon the angle of the tab to the circuit board. Thus, the testing device places electrical testing probes in contact with electrical tabs with only a very small degree of force being employed so as not to damage the electrical tabs or its electrical connection. Also, the testing apparatus can be easily installed and removed from a circuit device and moved to another circuit device.

DETAILED DESCRIPTION OF THE SHOWN EMBODIMENT

Figure 1:
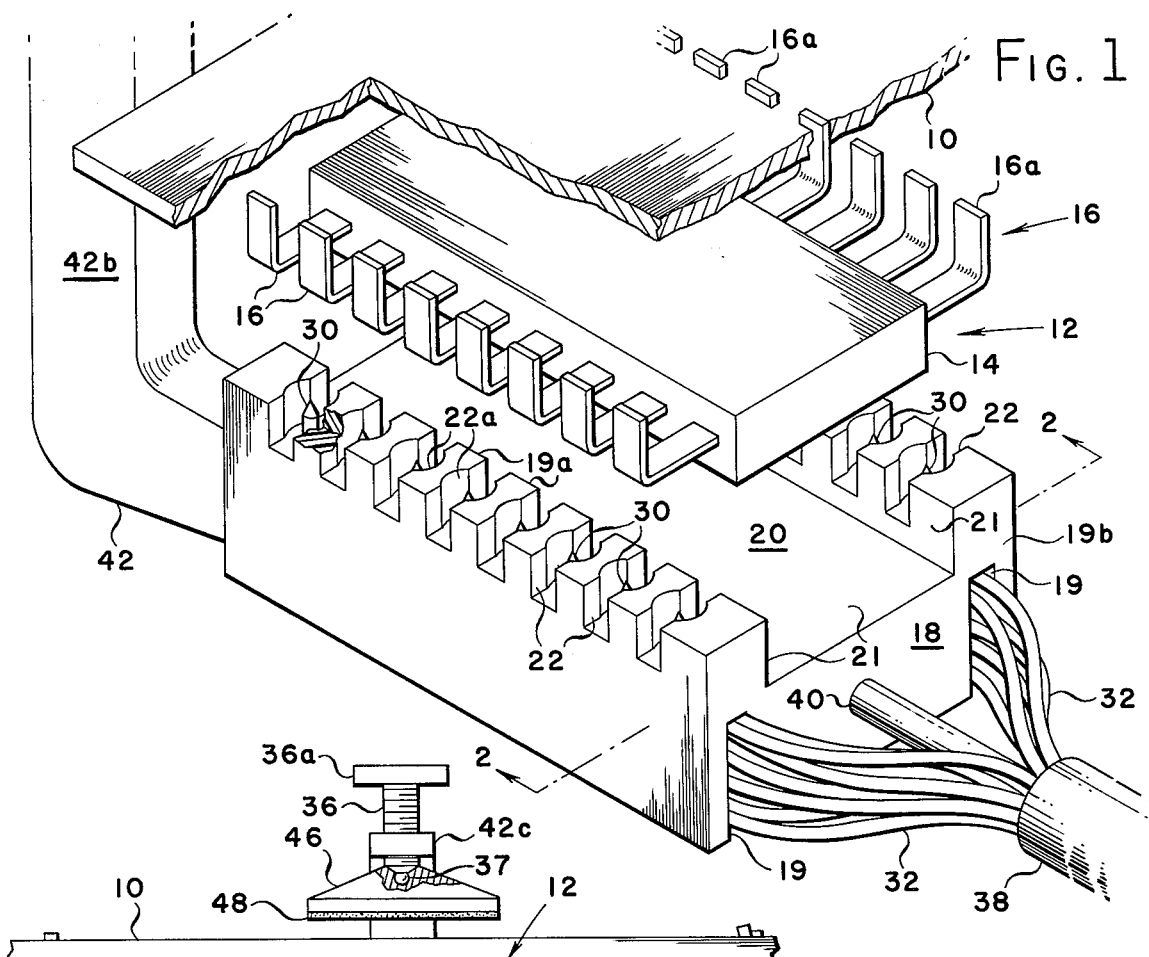
FIG. 1 is an exploded, partly in section, isometric view of the apparatus of this invention showing how such would be employed to effect a testing procedure of an integrated circuit device.
Figure 2:
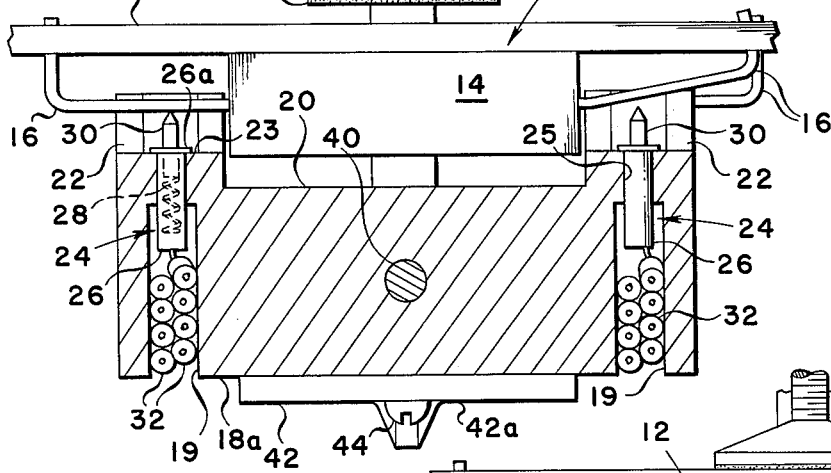
FIG. 2 is a cross-sectional view through the apparatus of this invention taken along line 2—2 of FIG. 1 showing the apparatus in a partly installed position.
Figure 3:
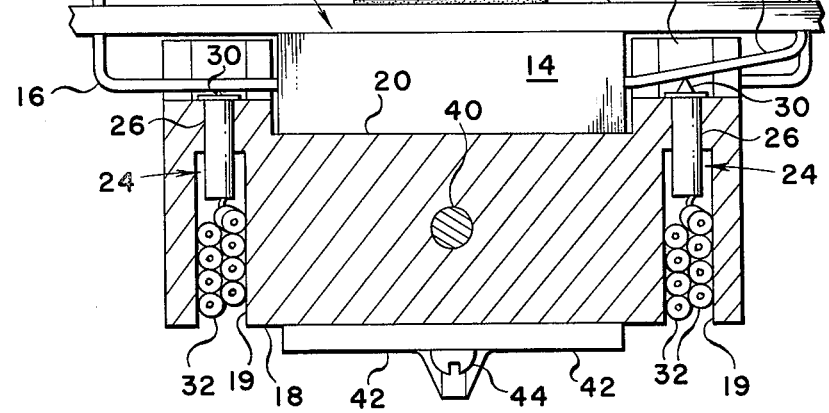
FIG. 3 is a view similar to FIG. 2 but showing the apparatus in a completely installed position.

Referring particularly to the drawing, there is broadly shown a printed circuit board 10 upon which is adapted to be physically mounted a plurality of electrical devices, such as the integrated circuit device 12. The integrated circuit device 12 includes a rectangular flat body section 14 to which are attached on each side thereof a plurality of electrical contact tabs 16. The ends 16a of the tabs 16 are bent at substantially a right angle and the ends are electrically connected with an electrical circuit (not shown) located on the printed circuit board 10. In order to install the device 12 upon the printed circuit board 10, the tab end 16a may electrically connect only at the surface of the board 10 or the tabs 16 may extend partially through the board 10 or then may extend completely through the board 10. Some of the tabs 16 will therefore assume different angular positions with respect to the body section 14, such as is shown in FIGS. 2 and 3 of the drawing. The testing device of this invention is adapted to accommodate any angular position of the tabs 16.

The apparatus of this invention includes an elongated housing 18 which may be formed of any rigid dielectric material. The housing 18 on its upper surface includes an elongated channel surface 20 located between upward edge projections 19a and 19b. The channel surface 20 and the projections 19a and 19b form an elongated channel 21 adapted to receive the body section 14 in a close fitting manner. The projections 19a and 19b each contain eight slots 22 and below each projection is located a partition 23 which contains a hole 25 opposite each slot. Below each hole, the housing 18 contains a channel 19 which extends to the bottom surface 18a of the housing 18. Each hole 25 receives a body 26 of a probe assembly 24 and the body 26 extends into a channel 19 and is positioned in the hole 25 by a body flange 26a which engages a partition 23. Each slot 22 has an enlargement 22a to receive a flange 26a. A coil spring 28 is located within each body 26 and engages a needle pointed probe 30 which extends out of the end of body 26. The spring 28 continuously biases the probe 30, which may be either needle pointed or compliantly tipped, to the fully extended position as shown for the probe on the right side of FIG. 2 when no pressure is applied to the probe. Moving of the probe 30 against the action of the spring 28 to the retracted position as shown for the probe on the left side of FIG. 3 in a typical construction requires only between one-fourth ounce and one ounce of pressure.

Each probe assembly 24 is connected to an electrical wire, one of which is indicated at 32. The eight wires (32) on the left side of the housing 18 are located in the left channel 19 and the eight wires (32) on the right side of the housing 18 are located in the right channel 19. The wires exiting from both the channels 19 are covered by an outer jacket 38 forming a wire bundle which connects with the test equipment (not shown). It is undesirable to permit the wire bundle 38 to move freely with respect to the housing 18 and this is avoided by the use of a strain relief stud 40 which is fixedly mounted at one end to the housing 18 and extends to within the confines of the wire bundle formed by the outer jacket 38. Therefore, independent movement of the end of the outer jacket 38 with respect to the housing 18 is prevented. This means that there is less likelihood that the wires (32) and their respective probe assembly 24 will become separated or broken.

In order to install the housing 18 in position, a clamping means is employed which takes the form of a basic (but enlarged) C-clamp member 42. The housing 18 is mounted upon one leg 42a of the C-clamp member 42 by means of fastener 44 which permits pivoting movement of the housing 18 upon the C-clamp member 42. The reason for this pivoting movement is so that the housing 18 may be canted at various angles relative to the C-clamp in order to accommodate various angular positions of the integrated circuit device 12 upon the printed circuit board 10.

The other leg 42c of the C-clamp member 42, which is located opposite leg 42a by upright leg 42b, mounts a threaded rod 36 which is rotatable by a handle 36a at its upper end. A movable foot member 46 is secured to the other end of end 36 and is movable by handle 36a toward and away from circuit board 10. A swivel connection 37 is provided between the foot member 46 and the end of rod 36 so that the foot member 46 can pivot as it engages the circuit board to accommodate variance between the printed circuit board 10 and the C-clamp member 42. The face of the foot member 46 will normally include a pad 48 of cushioning material, such as foam rubber or the like.

In operation, the test probe apparatus of this invention is to be placed opposite the printed circuit board 10 so that the printed circuit board 10 and its grouping of integrated circuit devices 12 will be located between the legs of the C-clamp member 42. The housing 18 is then positioned directly adjacent the particular device 12 which is to be tested and the elongated recess 20 is aligned with the body section of the device 12 and the tabs 16 are aligned with the slots 22. This position is basically shown in FIG. 2 of the drawing. In this position, the foot member 46 is moved relative to leg 42c of the C-clamp member 42 until it contacts the upper surface of the circuit board 10. The inward movement of the foot member 46 is continued until the body section 14 of the device 12 engages the surface of recess 21 as illustrated in FIG. 3. In this position, all of the needle pointed probes 30 will be simultaneously in contact with the respective tabs 16. At this particular time, the test procedure to determine the functioning ability of the device 12 is then performed. It is pointed out that the probes extend sufficiently to engage both the straight and angular tabs 16 (see FIG. 3) so that all tabs can be tested. Further, the probes place only slight pressure on the tabs so that they will not be loosened from body 14 during the testing procedure. Also, the depth of recess 21 is such that the probes are not subject to additional pressure after reaching their retracted position.

Once the test procedure has been performed, the test apparatus of this invention is removed from the particular device 12 and is repositioned upon another device 12 for the procedure to be repeated.

What is claimed is:

1. A test probe apparatus adaptable to connect with an integrated circuit device which is mounted on a circuit board and which has a plurality of electrical contact tabs protruding therefrom, said test probe comprising:

guide means including an elongated channel having a side slot for each of said contact tabs, the body portion of said integrated circuit device adapted to closely fit within said elongated channel whereby said circuit device is in a preselected position for testing thereof;

a plurality of separate spaced apart electrical contact probes mounted within said housing in a pattern to contact said tabs at an angle substantially normal thereto when said circuit device engages said housing, each said contact probe being resiliently biased normal against the engaged tab with a pressure not sufficient to damage the connection of said tab to said circuit device;

releasable clamping means for engaging the surface of said circuit board away from said circuit device and the surface of said guide means away from said guide means for securing said housing in engaged position with said integrated circuit device;

said guide means is pivotally mounted upon said releasable clamping means to permit canting of said guide means at various angles in respect to said clamping means; and a separate conductive wire connected to each of said probes for testing said circuit device.

2. A test probe apparatus adaptable to connect with an integrated circuit device which is mounted on a circuit board and which has a plurality of electrical contact tabs protruding therefrom, said test probe comprising;

guide means including an elongated channel having a side slot for each of said contact tabs, the body portion of said integrated circuit device adapted to closely fit within said elongated channel whereby said circuit device is in a preselected position for testing thereof;

a plurality of separate spaced apart electrical contact probes mounted within said housing in a pattern to contact said tabs at an angle substantially normal thereto when said circuit device engages said housing, each said contact probe being resiliently biased normal against the engaged tab with a pressure not sufficient to damage the connection of said tab to said circuit device;

releasable clamping means for securing said housing in a fixed position upon said integrated circuit device;

said guide means being pivotally mounted upon said releasable clamping means to permit canting of said guide means at various angles in respect to said clamping means; and a separate conductive wire connected to each of said probes for testing said circuit device.

3. The apparatus as defined in claim 2 wherein:

each said probe being movable with respect to said guide means from an extended position to a retracted position, each said probe being continuously biased toward said extended position.

4. The apparatus as defined in claim 3 wherein:

releasable clamping means for securing said housing in a fixed position upon said integrated circuit device; and said guide means being pivotally mounted upon said releasable clamping means to permit canting of said housing at various angles in respect to said clamping means.

* * * * *